United States Patent [19]

Shimizu et al.

[11] Patent Number: 5,072,271
[45] Date of Patent: Dec. 10, 1991

[54] PROTECTION CIRCUIT FOR USE IN SEMICONDUCTOR INTEGRATED CIRCUIT DEVICE

[75] Inventors: Mitsuru Shimizu, Sakura; Yoshio Okada, Tokyo; Kiyofumi Sakurai, Kawasaki, all of Japan

[73] Assignee: Kabushiki Kaisha Toshiba, Tokyo, Japan

[21] Appl. No.: 563,120

[22] Filed: Aug. 6, 1990

[30] Foreign Application Priority Data

Sep. 1, 1989 [JP]  Japan ................................. 1-227028

[51] Int. Cl.⁵ ...................... H01L 29/70; H01L 27/04
[52] U.S. Cl. .................................. 357/23.13; 357/34
[58] Field of Search ................ 357/23.13, 43, 34, 13, 357/20, 46, 35

[56] References Cited

U.S. PATENT DOCUMENTS

| | | | |
|---|---|---|---|
| 3,577,043 | 5/1971 | Cook | 357/23.13 |
| 4,028,564 | 6/1977 | Streit et al. | 307/310 |
| 4,430,581 | 2/1984 | Mogi et al. | 307/296 R |
| 4,491,746 | 1/1985 | Koike | 307/296 R |
| 4,739,437 | 4/1988 | Morgan | 387/23.13 |
| 4,757,363 | 7/1988 | Bohm et al. | 357/23.13 |
| 4,791,317 | 12/1988 | Winnerl et al. | 307/296 R |
| 4,829,350 | 5/1989 | Miller | 357/23.13 |
| 4,994,874 | 2/1991 | Shimizu et al. | 357/23.13 |
| 4,996,626 | 2/1991 | Say | 357/23.13 |

FOREIGN PATENT DOCUMENTS 55-72081  5/1980  Japan .
56-100076  6/1981  Japan .

Primary Examiner—Rolf Hille
Assistant Examiner—S. V. Clark
Attorney, Agent, or Firm—Banner, Birch, McKie & Beckett

[57] ABSTRACT

A protection circuit is inserted between a signal input pad and an internal circuit. The protection circuit includes a parasitic bipolar transistor which is obtained by forming high-impurity concentration semiconductor regions in the major-surface region of a substrate. In practice, it is hard to provide a parasitic bipolar transistor of a sufficiently large size, since the reduction of the size of a chip is a recent trend. With this in mind, a third semiconductor region serving as an electron-trapping region is formed in a region outside of the location where the parasitic bipolar transistor is formed. If an excessive voltage produced by ESD or the like is applied to the pad, and the excessive voltage uncontrollable by the parasitic bipolar transistor, the third semiconductor region absorbs the excessive voltage. In particular, where the current capacity of the parasitic bipolar transistor is small, the third semiconductor region reliably prevents electrostatic destruction of a circuit element. Accordingly, the protection circuit enables the parasitic bipolar transistor to be reduced in size, thus contributing to miniaturization of a chip. Moreover, the protection circuit is reliable in operation.

16 Claims, 4 Drawing Sheets

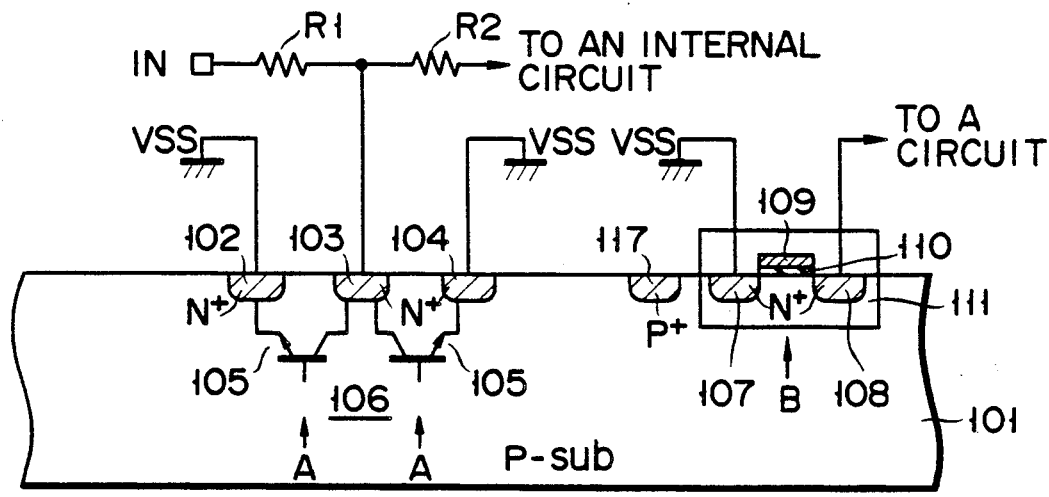
F I G. 1A
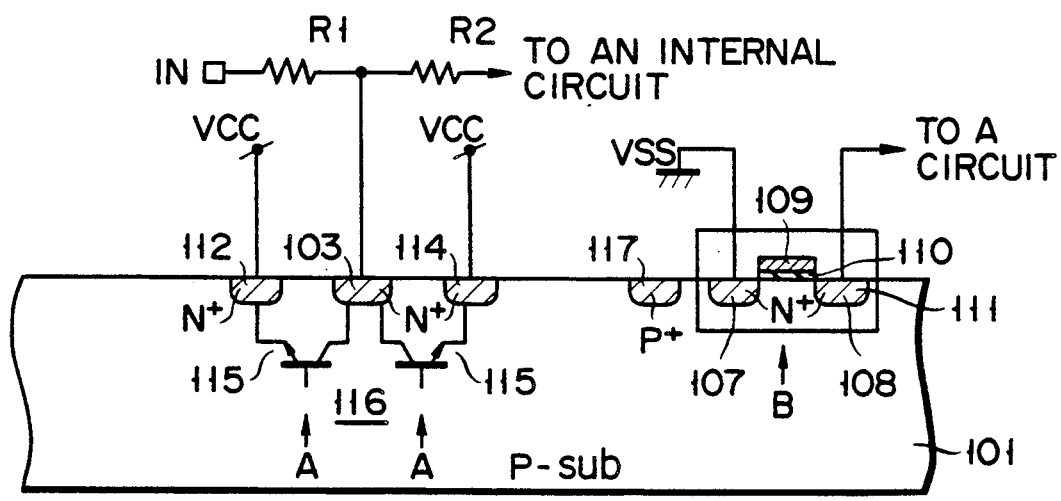
F I G. 1B

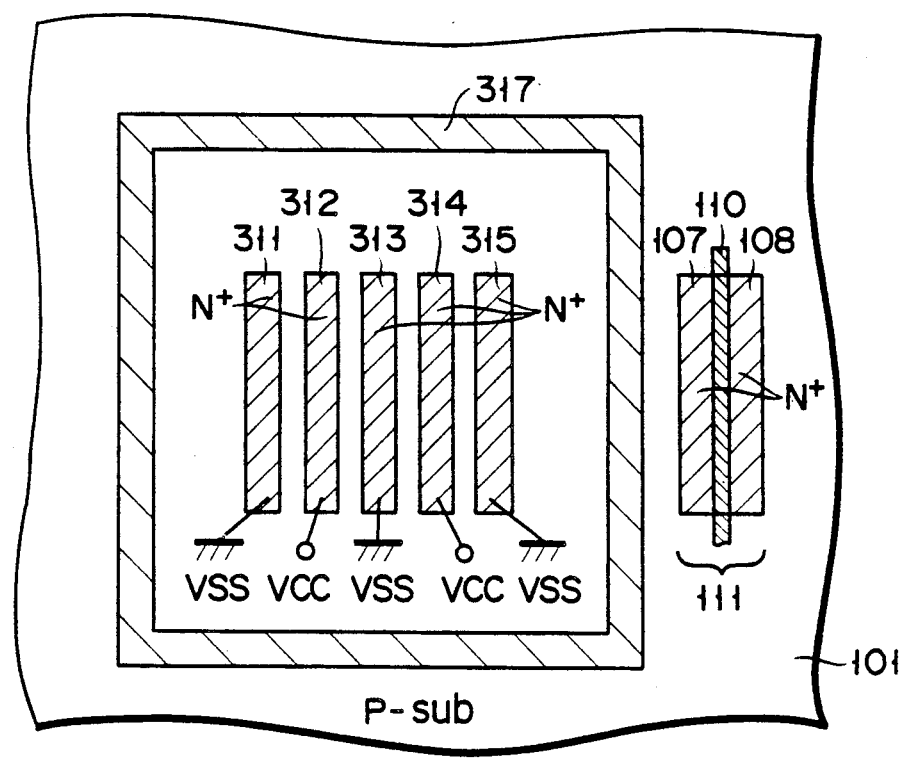
F I G. 4
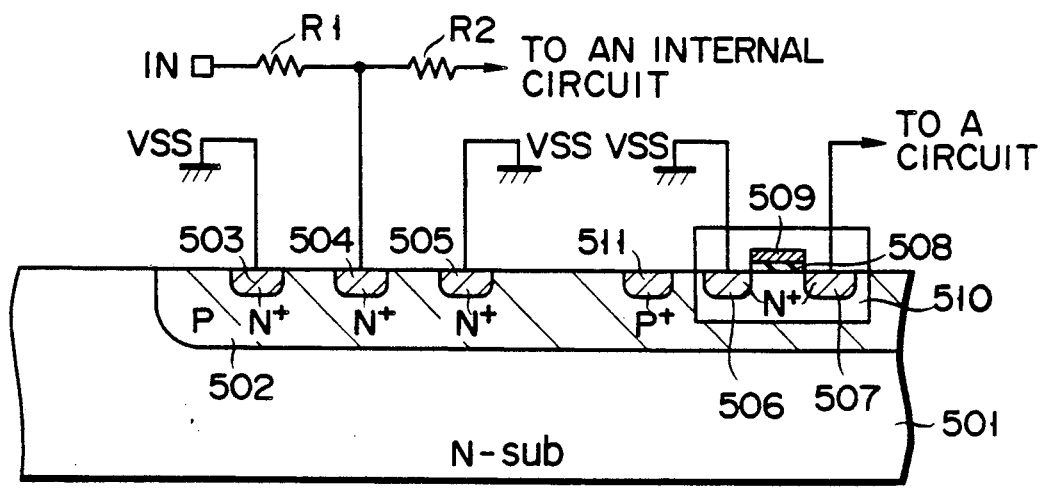
F I G. 5A

5,072,271

PROTECTION CIRCUIT FOR USE IN SEMICONDUCTOR INTEGRATED CIRCUIT DEVICE

BACKGROUND OF THE INVENTION

1. Field of the Invention

The present invention relates to a protection circuit which protects the circuit elements of a semiconductor integrated circuit device, and more particularly to a protection circuit which prevents the circuit elements formed in the vicinity of an external terminal from being electrostatically destroyed even if a voltage arising from electrostatic discharge (hereinafter referred to as ESD) is abruptly applied to the external terminal.

2. Description of the Related Art

If the input pin of the semiconductor device is applied with a high voltage arising from ESD (e.g., the discharge of static electricity from the human body, etc.), it may happen that internal elements of a semiconductor device will be electrostatically destroyed. In order to prevent such electrostatic destruction, the semiconductor device is provided with a protection circuit located between the signal input pad of a semiconductor integrated circuit and the input circuit of internal elements.

The protection circuit is obtained by parasitically producing a bipolar transistor in the semiconductor device. An example of a conventional parasitic bipolar transistor of this type will be described. Let it be assumed that a signal input pad is connected to the input terminal of the input buffer of an internal circuit, by way of a first resistor for protection (e.g., a diffusion layer formed in the surface region of a semiconductor substrate) and a second resistor which is parasitically produced by provision of wiring layers on the semiconductor substrate. In this case, a parasitic bipolar transistor is produced such that it electrically connects the first and second resistors to either a power supply terminal or a grounded terminal.

In this conventional parasitic bipolar transistor, the substrate of the semiconductor integrated circuit functions as a base, a first diffusion region connected to the protective resistor functions as a collector, and a second diffusion region which is formed in the major-surface region of the substrate and is connected to either the power supply terminal or the grounded terminal functions as an emitter. With this structure, even if positive static charge is abruptly applied to the signal input pad, it is guided to either the power supply terminal VCC or the grounded terminal VSS through the parasitic bipolar transistor.

However, with the recent trend toward both high integration of semiconductor devices and use of smaller-size chips, it has become difficult to ensure a sufficiently large pattern area for the above parasitic bipolar transistor. In addition, since the resistance of the power supply lines provided inside a chip tends to increase in accordance with a decrease in the size of the chip, it may happen that the above-mentioned bipolar transistor will fail to reliably guide an excessive current to the outside of the semiconductor device. In particular, if the excessive current is produced by ESD and is therefore large in amount, it cannot be guided to the outside of the semiconductor device. As a result, the gates of the circuit elements formed on the neighboring substrate surface portion and the junctions inside the substrate are likely to be destroyed.

SUMMARY OF THE INVENTION

Accordingly, an object of the present invention is to provide a protection circuit which is adapted for use in a semiconductor integrated circuit device and is capable of reliably preventing electrostatic destruction of circuit elements.

To achieve this object, the present invention provides a protection circuit, for use in a semiconductor integrated circuit, which comprises: a semiconductor body of a first conductivity type; an active element formed in a major-surface region of the semiconductor body and constituting part of an internal circuit; an input-protecting bipolar transistor including a first semiconductor region, of a second conductivity type, which is formed in the major-surface region of the semiconductor body and is connected to an external terminal, and a second semiconductor region, of the second conductivity type, which is formed in the majorsurface region of the semiconductor body and is kept at a predetermined potential level, the first and second semiconductor regions functioning as collector and emitter regions, respectively, and that portion of the semiconductor body which is located between the collector and emitter regions functioning as a base region; and a third semiconductor region being of the first conductivity type and formed between the active element and that one of the first and second semiconductor regions which is located closer to the active element than the other, wherein the third semiconductor region absorbs an excessive voltage if this voltage is uncontrollable by the input-protecting bipolar transistor.

In the protection circuit mentioned above, the third semiconductor region is located outside of the region of the bipolar transistor and serves to trap electrons. Even if a large amount of excessive current uncontrollable by the parasitic bipolar transistor is produced as a result of an excessive voltage applied due to ESD or the like, such excessive current is guided to the outside of the semiconductor device by way of the third semiconductor region. The third semiconductor region is particularly effective in protecting the neighboring circuit elements from electrostatic destruction, where the current-carrying capacity of the parasitic bipolar transistor is small.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B are sectional views of a protection circuit according to the first embodiment of the present invention, FIG. 1A illustrating a parasitic bipolar transistor located on the side of a grounded terminal, together with its neighboring structure, and FIG. 1B illustrating a parasitic bipolar transistor located on the side of a power supply terminal, together with the neighboring structure;

FIG. 4 is a planar pattern view of the structure shown in FIG. 3;

FIGS. 5A and 5B are sectional views of a protection circuit according to the fourth embodiment of the present invention, FIG. 5A illustrating a parasitic bipolar transistor located on the side of a grounded terminal, together with its neighboring structure, and FIG. 5B illustrating a parasitic bipolar transistor located on the side of a power supply terminal, together with the neighboring structure.

DETAILED DESCRIPTION OF THE PREFERRED EMBODIMENTS

Figure 2:
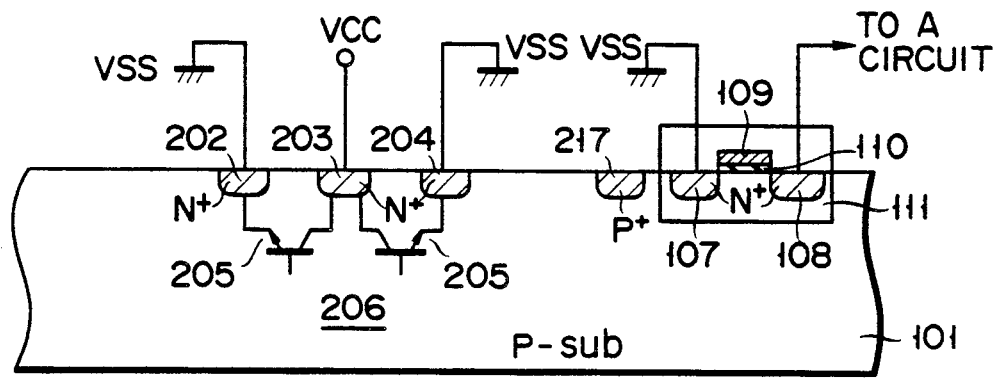
FIG. 2 is a sectional view showing the structure of the second embodiment of the present invention.

Embodiments of the present invention will now be described, with reference to the accompanying drawings.

FIGS. 1A and 1B show the structure of a protection circuit according to one embodiment of the present invention, the protection circuit being formed between the signal input pad of a semiconductor integrated circuit device and an internal circuit thereof. The signal input pad IN is connected to the input terminal of the internal circuit (e.g., an input buffer which is not shown), with resistors R1 and R2 inserted therebetween. Resistor R1 is a protective resistor and is constituted by a diffusion layer or the like which is formed in a surface region of a semiconductor substrate, while resistor R2 is a parasitic resistor and is produced as a result of the formation of wiring layers on the semiconductor substrate. Between these resistors, a protection circuit is inserted. This protection circuit includes a parasitic bipolar transistor having such a structure as is shown in FIGS. 1A and 1B.

FIG. 1A is a sectional view of the element structure of the parasitic bipolar transistor which is included in the protection circuit and is located on the side of a grounded terminal VSS. Referring to FIG. 1A, n+-type semiconductor regions 102, 103 and 104 are formed in the surface region of a p-type semiconductor substrate 101. The semiconductor regions 102, 103 and 104 are isolated from each other. Of the three semiconductor regions, semiconductor region 103 functions as the collector region of the parasitic bipolar transistor and is connected to the input pad IN. The remaining semiconductor regions 102 and 104 each function as an emitter region, and are connected to the grounded terminal VSS. The substrate portion located between semiconductor regions 102 and 103 and the semiconductor portion located between semiconductor regions 103 and 104 each function as a base region of the parasitic bipolar transistor. As may be understood, a group of small bipolar transistor units 105 are formed such that they jointly constitute the bipolar transistor 106 mentioned above.

In that surface region of the semiconductor substrate 101 which is located in the neighborhood of the parasitic bipolar transistor 106, n+-type semiconductor regions 107 and 108 are formed while being isolated from each other. These semiconductor regions 107 and 108 respectively function as a source and a drain region of a MOSFET to be mentioned later. A gate electrode 110 is formed on the substrate 101 in such a manner that it is located between the semiconductor regions 107 and 108. A gate oxide film 109 is interposed between the gate electrode 110 and the substrate 101. The semiconductor regions 107 and 108, the gate oxide film 109, and the gate electrode 110 jointly constitute the MOSFET 111, and this MOSFET 111 is part of a large number of circuit elements formed on the substrate 101. The semiconductor region 108 is connected to a circuit made up of a large number of elements.

FIG. 1B is a sectional view of the element structure of the parasitic bipolar transistor which is included in the protection circuit and is located on the side of a power supply terminal VCC. The parasitic bipolar transistor is paired with the above-mentioned parasitic bipolar transistor located on the side of the grounded terminal VSS, and is formed adjacent thereto. The parasitic bipolar transistor located on the side of the power supply terminal VCC has a similar structure to that of the parasitic bipolar transistor located on the side of the grounded terminal VSS. Specifically, the emitter regions 112 and 114 are connected to the power supply terminal VCC, and a plurality of small bipolar transistor units 115 are formed in such a manner as to jointly constitute a parasitic bipolar transistor 116.

The MOSFET 111 mentioned above is located at a position which is very liable to be affected if an excessive voltage caused by ESD or the like is applied to the input pad IN. In this embodiment, therefore, a p+-type semiconductor region 117 having a high impurity concentration is formed between the parasitic bipolar transistors 106, 116 and the MOSFET 111. This high-impurity concentration semiconductor region 117 is formed by doping impurities into the substrate 101 with dose of $1 \times 10^{15}/cm-2$, for example.

The bases of the two parasitic bipolar transistors 106 and 116 are maintained at the same potential as the substrate potential. If the static electricity applied to the pad IN is negative, it is guided to the power supply terminal VCC through transistor 116. If the static electricity applied to the pad IN is positive, it is guided to the grounded terminal VSS through transistor 106. However, if an excessive voltage applied to the pad IN is too high and is uncontrollable by the parasitic bipolar transistors 106 and 116, such an excessive voltage is absorbed by the semiconductor region 117. Thus, the circuit elements formed on the substrate are protected from such a high voltage.

Let it be assumed that the substrate potential applied to the bases of the parasitic bipolar transistors 106 and 116 is expressed by $V_{BB}$. In this case, the potential $V_{BB}$ applied to the locations indicated by arrow A differs from that applied to the locations indicated by arrow B, since the semiconductor region 117 is formed therebetween. More specifically, if an excessive voltage produced due to ESD or the like is applied to the input pad IN, those electrons which cannot be guided to the outside of the device by the parasitic bipolar transistors 106 and 116 are captured by the positive holes existing in the p+-type semiconductor region 117. After captured or trapped in the p+-type semiconductor region 117, the electrons are gradually discharged into the substrate 101 which is of the same conductivity type as the semiconductor region 117.

In the manner mentioned above, the MOSFET 111, which is most likely to be electrostatically destroyed due to the location thereof, is protected.

FIG. 2 is a sectional view showing the structure of a protection circuit according to the second embodiment of the present invention. In this embodiment, the present invention is embodied as a protection circuit located between a high-potential power supply terminal VCC and a low-potential grounded terminal VSS. In the second embodiment, n+-type semiconductor regions 202, 203, and 204 are formed in the surface regions of a p-type semiconductor substrate 101 while being isolated from each other. The n+-type semiconductor regions 202, 203 and 204 and the p-type substrate 101 jointly constitute a parasitic bipolar transistor, as in the embodiment shown in FIGS. 1A and 1B.

The second embodiment shown in FIG. 2 differs from that shown in FIGS. 1A and 1B, in that the semiconductor region 203 is connected to the power supply terminal VCC. With this structure, a plurality of bipolar transistor units 205 are formed between the two power supply terminals in such a manner as to constitute a parasitic bipolar transistor 206. In order to prevent electrostatic destruction of a MOSFET 111 located in the neighborhood of the parasitic bipolar transistor 206, a p+-type semiconductor region 217 having a high concentration of p-type impurities is formed between the parasitic bipolar transistor 206 and the MOSFET 111. The semiconductor region 217 is maintained at the same potential as the substrate 101.

Figure 3:
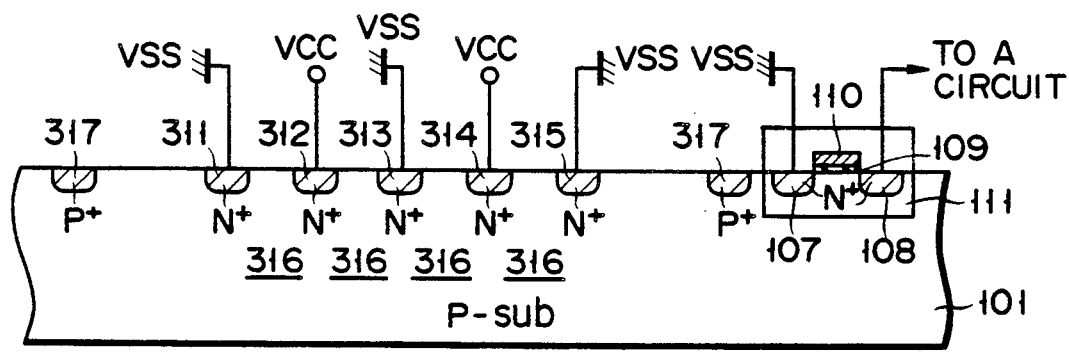
FIG. 3 is a sectional view showing the structure of the third embodiment of the present invention.

FIG. 3 is a sectional view showing the structure of a protection circuit according to the third embodiment of the present invention. In this embodiment, the protection circuit is formed by a bipolar transistor 316 which is similar to the parasitic bipolar transistor shown in FIG. 2, and a p+-type semiconductor region 317 is formed in such a manner as to surround the protection circuit. The semiconductor region 317 is maintained at the same potential level as the substrate 101.

FIG. 4 is a planar pattern view of the structure shown in FIG. 3. As is clearly shown in FIG. 4, regions 312 and 314 which function as the collectors of parasitic bipolar transistors located between the two power supply terminals, and regions 311, 313 and 315 which function as the emitters of the parasitic bipolar transistors are formed in the surface region of the substrate 101. Regions 312 and 314 are connected to the power supply terminal VCC, while regions 311, 313 and 315 are connected to the grounded terminal VSS. The p+-type semiconductor region 317 completely surrounds these parasitic bipolar transistors, to thereby obtain the protection circuit according to the third embodiment.

The protection circuit mentioned above is arranged in the neighborhood of each of the power supply terminal VCC and the grounded terminal VSS. With this arrangement, even if an excessive voltage applied to the power supply terminal VCC or grounded terminal VSS cannot be guided to the outside of the device by the parasitic bipolar transistor, it is uniformly suppressed by semiconductor region 317. Accordingly, the circuit elements located around the semiconductor region 317 can be protected from the excessive voltage. Needless to say, the circuit elements (e.g., MOSFET 111) located in the vicinity of the parasitic bipolar transistor can be protected from electrostatic destruction in a more reliable manner.

Figure 5B:
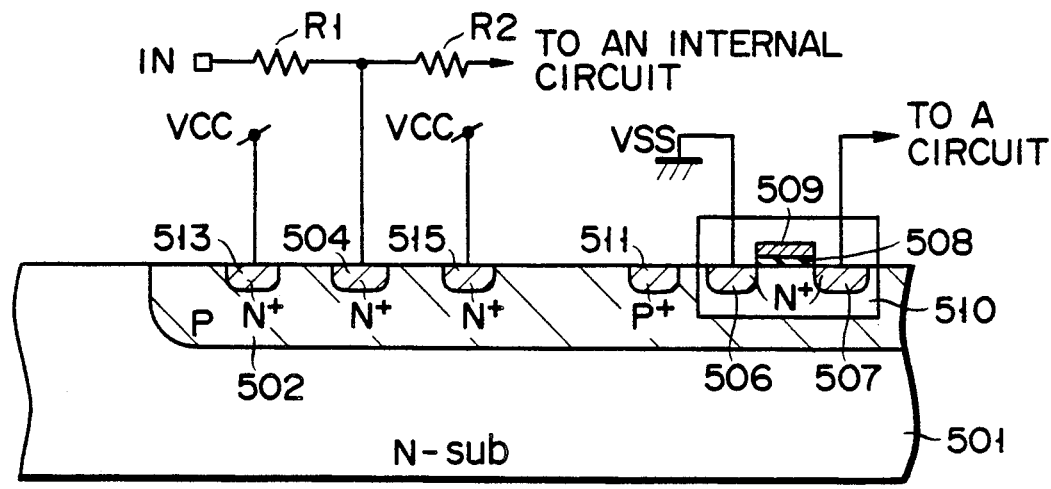
Figure 6:
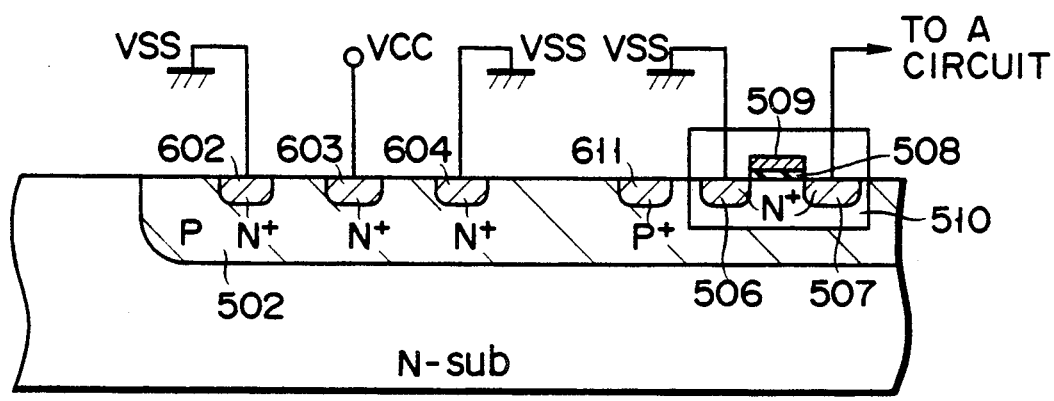
FIG. 6 is a sectional view showing the structure of the fifth embodiment of the present invention.

In the foregoing embodiments, the protection circuit is obtained by forming semiconductor regions in the major-surface region of the p-type semiconductor substrate. However, the protection circuit may be formed by providing a p-type well region in the major-surface region of an n-type semiconductor substrate and forming semiconductor regions in the p-type well region. An example of such an alternative structure is shown in FIGS. 5A-5B and FIG. 6. In principle, the structure shown in FIGS. 5A-5B and FIG. 6 is similar to the structure described above with reference to FIGS. 1A-1B and FIG. 2.

As mentioned above, the protection circuits of the foregoing embodiments enable the size of a parasitic bipolar transistor for input protection to be reduced, thus enabling miniaturization of a semiconductor chip. Moreover, the protection circuits reliably suppress an excessive voltage produced due to ESD or the like.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A protection circuit for a semiconductor integrated circuit device having an active element formed in a semiconductor body of a first conductivity type, said protection circuit comprising:
    an input-protecting bipolar transistor including:
        a collector comprising a first semiconductor region of a second conductivity type formed in a major surface of said semiconductor body and connected to an external terminal;
        an emitter comprising a second semiconductor region of said second conductivity type formed in said major surface of said semiconductor body and biased up to a predetermined potential; and
        a base region comprising a portion of said semiconductor body which is located between said collector and emitter; and
    a third semiconductor region of said first conductivity type and formed between said active element and that one of said first and second semiconductor regions which is located closer to said active element, wherein said third semiconductor region absorbs charge to said device which may be beyond the protective capabilities of input-protecting bipolar transistor.

2. A protection circuit according to claim 1, wherein said semiconductor body is a semiconductor substrate, and said first and second semiconductor regions are impurity regions having a high impurity concentration.

3. A protection circuit according to claim 1, wherein said semiconductor body is a well region formed in a major surface of a semiconductor substrate of said second conductivity type, and said first and second semiconductor regions are impurity regions having a high impurity concentration.

4. A protection circuit according to claim 1, wherein said external terminal to which the first semiconductor region is connected comprises an input pad from which an external signal is input.

5. A protection circuit according to claim 1, wherein said second semiconductor region includes a plurality of second semiconductor portions, which are selectively connected to a power supply terminal or a grounded terminal.

6. A protection circuit according to claim 1, wherein said third semiconductor region is an impurity region having a high impurity concentration and which functions as an electron-trapping region.

7. A protection circuit according to claim 1, wherein said third semiconductor region surrounds said input-protecting bipolar transistor.

8. A protection circuit for a semiconductor integrated circuit device having an active element formed in a semiconductor body of a first conductivity type, said protection circuit comprising:

an input-protecting bipolar transistor including:
 a collector comprising a first semiconductor region of a second conductivity type formed in a major surface of said semiconductor body and biased to a firs potential;
 an emitter comprising a second semiconductor region of said second conductivity type formed in said major surface of said semiconductor body and biased to a second potential; and
 a base region comprising a portion of said semiconductor body which is located between said collector and emitter; and
a third semiconductor region of said first conductivity type and formed between said active element and that one of said first and second semiconductor regions which is located closer to said active element, wherein said third semiconductor region absorbs charge to said device which may be beyond the protective capabilities of the input-protecting bipolar transistor.

9. A protection circuit according to claim 8, wherein said semiconductor body is a semiconductor substrate, and said first and second semiconductor regions are impurity regions having a high impurity concentration.

10. A protection circuit according to claim 8, wherein said semiconductor body is a well region formed in a major surface of a semiconductor substrate of said second conductivity type, and said first and second semiconductor regions are impurity regions having a high impurity concentration.

11. A protection circuit according to claim 8, wherein said third semiconductor region is an impurity region having a high impurity concentration and which functions as an electron-trapping region.

12. A protection circuit according to claim 8, wherein said first potential is a power supply potential, and said second potential is a ground potential.

13. A protection circuit according to claim 12, wherein said first semiconductor region includes a plurality of first semiconductor portions and said second semiconductor region includes a plurality of second semiconductor portions, said first and second semiconductor portions being alternately arranged on said semiconductor body and separated from each other by a predetermined distance.

14. A protection circuit according to claim 8, wherein said third semiconductor region surrounds said input-protecting bipolar transistor.

15. A protection circuit according to claim 1, wherein said first conductivity type is p-type and said second conductivity type is n-type.

16. A protection circuit according to claim 8, wherein said first conductivity type is p-type and said second conductivity is n-type.

* * * * *